United States Patent [19]

Ishino

[11] Patent Number: 4,532,472

[45] Date of Patent: Jul. 30, 1985

[54] LED LEVEL METER

[75] Inventor: Yoshihide Ishino, Tenri, Japan

[73] Assignee: Sharp Kabushiki Kaisha, Osaka, Japan

[21] Appl. No.: 623,550

[22] Filed: Jun. 25, 1984

Related U.S. Application Data

[63] Continuation of Ser. No. 282,239, Jul. 10, 1981, abandoned.

[30] Foreign Application Priority Data

Jul. 16, 1980 [JP] Japan .................................. 55-98069
Jul. 17, 1980 [JP] Japan .................................. 55-98283

[51] Int. Cl.$^3$ .......................... G01R 19/00; G01R 1/00
[52] U.S. Cl. ..................................... 324/122; 324/96; 324/103 P; 324/114
[58] Field of Search ............... 324/122, 96, 102, 103 P, 324/114; 340/753; 381/56

[56] References Cited

U.S. PATENT DOCUMENTS 4,166,245  8/1979  Roberts .......................... 324/103 P
4,183,025  1/1980  Kutaragi et al. ................. 324/103 P

OTHER PUBLICATIONS

Lawrence, R. W.; "Stereo Digital PPM ..."; Practical Electronics; vol. 12; No. 10; Oct. 1976; pp. 808-816.

Primary Examiner—Ernest F. Karlsen
Attorney, Agent, or Firm—Birch, Stewart, Kolasch & Birch

[57] ABSTRACT

A stereo sound level display device includes a single array of light emitting diodes aligned in a line. The left channel sound signal level is detected to display the left channel sound signal level from the left end of the light emitting diode array. At the same time, the right channel sound signal level is detected to display the right channel sound signal level from the right end of the light emitting diode array.

11 Claims, 3 Drawing Figures

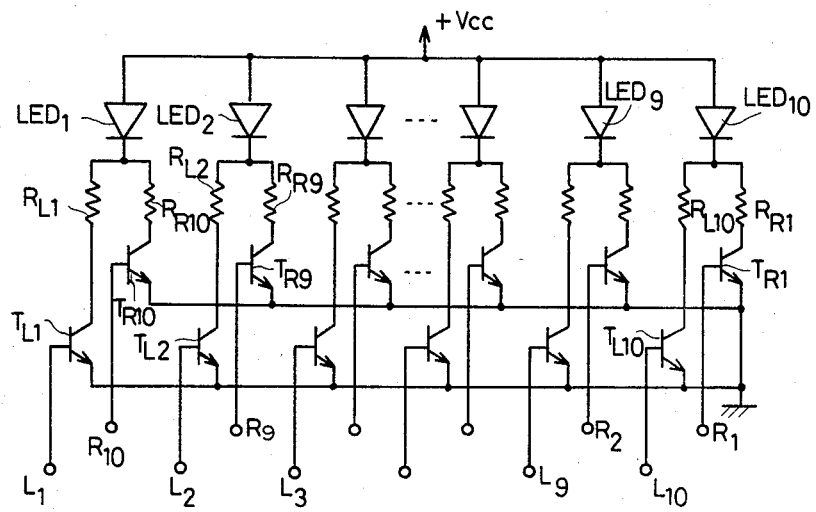
FIG. 1
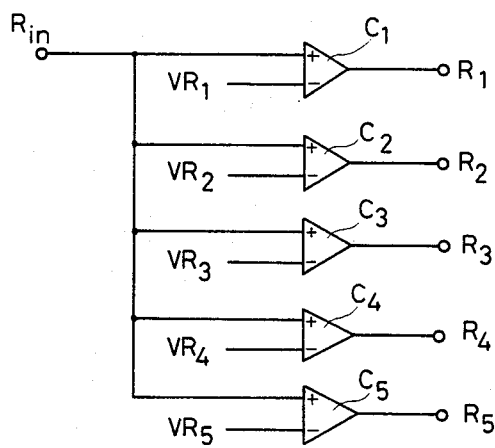
FIG. 3 (LEVEL DISCRIMINATOR -DR-)

LED LEVEL METER

This application is a continuation of application Ser. No. 282,239 filed on July 10, 1981, now abandoned.

BACKGROUND AND SUMMARY OF THE INVENTION

The present invention relates to an analog display of the segmented type for displaying a level of a detected signal.

LED (light emitting diode) level meters have been used in audio reproduction systems for displaying the level of input signals. A typical drive system for controlling the number of lighted LEDs in response to the level of the input signal is disclosed in, for example, U.S. Pat. No. 3,796,951, "SOLID STATE ELECTRONIC GAUGE" issued on Mar. 12, 1974, and U.S. Pat. No. 4,017,796, "ELECTRICAL CIRCUIT MEANS FOR USE IN ANALOGUE DISPLAY AND/OR CONTROL SYSTEM" issued on Apr. 12, 1977.

When the above-mentioned LED level meter is used to display the level of the stereo sound signal, two sets of the LED level meters are employed in the conventional system for displaying the right channel signal level and the left channel signal level, respectively.

Accordingly, an object of the present invention is to provide an analog display of the segmented type which displays the levels of plural signals at a same time.

Another object of the present invention is to provide an LED level meter for displaying a stereo sound signal level through the use of one array of LEDs.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a row of light emitting diodes are provided for indicating the level of one input signal from the left end of the row and for indicating the level of another input signal from the right end of the row. The one input signal can be the left channel sound signal, and the other input signal can be the right channel sound signal when the present level meter is used for displaying the audio signal level of the stereo sound.

In a preferred form, ten (10) light emitting diodes are aligned in a row to which a driver circuit is connected. The driver circuit functions to enable a preselected number of light emitting diodes from the left end of the row in response to the level of the left channel sound signal. The driver circuit further functions to enable a preselected number of light emitting diodes from the right end of the row in response to the level of the right channel sound signal. The driver circuit further functions to drive the light emitting diode which is located at the position where the number of diodes to be illuminated from the left end and the right end overlap each other at a brightness higher than the remaining light emitting diodes.

In another preferred form, a row of the light emitting diodes is connected to a driver circuit which functions to enable one light emitting diode representing the level of the input signal. More specifically, when the left channel sound signal has the level corresponding to four (4) LEDs and the right channel sound signal has the level corresponding to three (3) LEDs, the fourth LED counted from the left end of the row and the third LED counted from the right end of the row are enabled.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 1 is a circuit diagram of an embodiment of a driver circuit of the present invention;

FIG. 3 is a block diagram of a level discriminator included in the driver circuit of FIG. 2.

DESCRIPTION OF THE PREFERRED EMBODIMENTS

Figure 2:
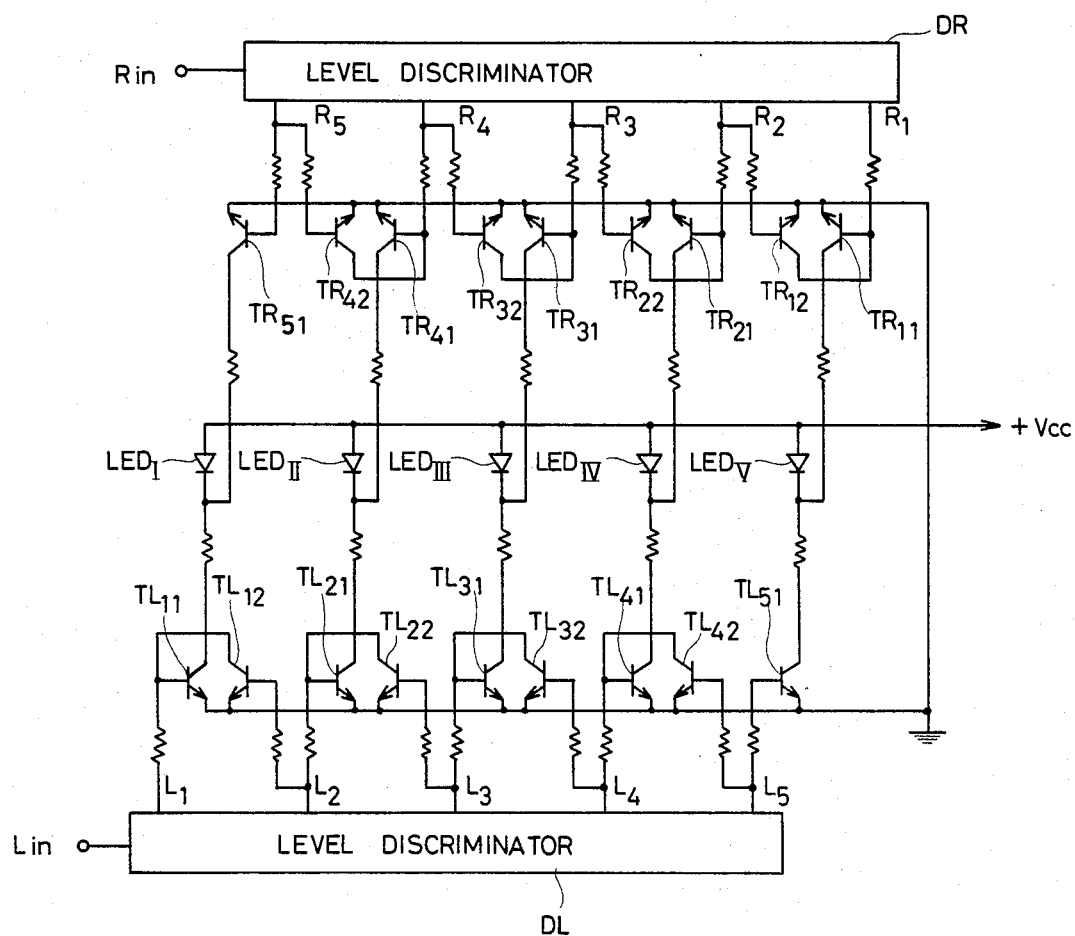
FIG. 2 is a circuit diagram of another embodiment of a driver circuit of the present invention.

FIG. 1 shows an embodiment of a level meter of the present invention, wherein the stereo sound signal level is displayed through the use of an array of ten (10) light emitting diodes $LED_1$ through $LED_{10}$.

The left channel signal level is displayed from the left end of the LED array, and the right channel signal level is displayed from the right end of the LED array. When the left channel signal has the level corresponding to four (4) LED segments, the LEDs $LED_1$ through $LED_4$ are enabled. At the same time, when the right channel signal has the level corresponding to two (2) LED segments, the LEDs $LED_9$ and $LED_{10}$ are enabled. That is, the LEDs $LED_1$, $LED_2$, $LED_3$, $LED_4$, $LED_9$ and $LED_{10}$ are enabled.

Each anode electrode of the LEDs is connected to a DC power source +Vcc. Each cathode electrode of the LEDs is connected to a parallel circuit including a series circuit of a resistor $R_{Li}$ and a transistor $T_{Li}$, and a series circuit of a resistor $R_{Rj}$ and a transistor $T_{Rj}$. The transistor $T_{Li}$ is connected to receive a switching signal from an input terminal Li for displaying the level of the left channel sound signal, and the transistor $T_{Rj}$ is connected to an input terminal Rj to receive a switching signal for displaying the level of the right channel sound signal. A right channel sound signal level discriminator is provided for developing the switching signal to be applied to the input terminal Rj, and a left channel sound signal level discriminator is provided for developing the switching signal to be applied to the input terminal Li.

In the foregoing example, when the left channel signal has the level corresponding to four (4) LED segments, the input terminals $L_1$ through $L_4$ receive the switching signal of the high level. Further, when the right channel signal has the level corresponding to two (2) LED segments, the input terminals $R_1$ and $R_2$ receive the switching signal of the high level. Thus, the transistors $T_{L1}$, $T_{L2}$, $T_{L3}$, $T_{L4}$, $T_{R1}$ and $T_{R2}$ are switched on to enable the LEDs $LED_1$, $LED_2$, $LED_3$, $LED_4$, $LED_9$ and $LED_{10}$.

If the left channel sound signal has the level corresponding to five (5) LED segments and the right channel sound signal has the level corresponding to seven (7) LED segments, the transistors $T_{L1}$ through $T_{L5}$ and $T_{R1}$ through $T_{R7}$ are switched on. Therefore, the LEDs $LED_4$ and $LED_5$ emit light higher than the remaining LEDs. More specifically, when the left channel signal level measured from the left end of the LED array and the right channel signal level measured from the right end of the LED array overlaps each other, the overlapped portion is driven to emit light stronger than the remaining LEDs.

FIG. 2 shows another embodiment of a level meter of the present invention, wherein the stereo sound signal level is displayed through the use of an array of five (5) light emitting diodes $LED_I$ through $LED_V$. In this embodiment, when the left channel sound signal has the level corresponding to one (1) LED segment and the right channel sound signal has the level corresponding to two (2) LED segments, the light emitting diodes $LED_I$ and $LED_{IV}$ are enabled.

Each anode electrode of the LEDs is connected to a DC power source +Vcc. Each cathode electrode of the LEDs is connected to a switching transistor $TL_{i1}$ which receives a switching signal derived from a left channel sound signal level discriminator DL. Each of the cathode electrodes is further connected to a switching transistor $TR_{j1}$ which is connected to receive a switching signal derived from a right channel sound signal level discriminator DR.

FIG. 3 schematically shows the construction of the right channel sound signal level discriminator DR. The level discriminator DR includes comparators $C_1$ through $C_5$. A reference voltage signal $VR_1$ is applied to the reference input terminal of the comparator $C_1$ and the data input terminal of the comparator $C_1$ receives the right channel sound signal $R_{in}$. The right channel sound signal $R_{in}$ is applied to the each of the data input terminals of the comparators. The reference voltage signal $VR_2$ is higher than the reference voltage signal $VR_1$. The reference voltage signal $VR_5$ is higher than the reference voltage signal $VR_4$ which is higher than the reference voltage signal $VR_3$ which, in turn, is higher than the reference voltage signal $VR_2$. When the right channel sound signal has the level corresponding to two (2) LED segments, the comparators $C_1$ and $C_2$ develop a switching signal of the high level at output terminals $R_1$ and $R_2$, respectively. The left channel sound signal level discriminator DL has the same construction as the right channel sound signal level discriminator DR.

In the embodiment of FIG. 2, when the left channel sound signal has the level corresponding to two (2) LED segments, the left channel sound signal level discriminator DL develops the switching signal of the high level at its output terminals $L_1$ and $L_2$. The switching signal derived from the output terminal $L_1$ functions to switch on the transistor $TL_{11}$. The switching signal derived from the output terminal $L_2$ functions to switch on the transistor $TL_{21}$. The switching signal derived from the output terminal $L_2$ further functions to turn on a transistor $TL_{12}$. When the transistor $TL_{12}$ is made conductive, the base electrode of the transistor $TL_{11}$ is forced to the ground level and, therefore, the transistor $TL_{11}$ is made non-conductive. Accordingly, the light emitting diode $LED_I$ is disabled, and only the light emitting diode $LED_{II}$ is enabled. The similar operation is conducted in the right channel side. Thus, when the left channel sound signal has the level corresponding to two (2) LED segments and the right channel sound signal has the level corresponding to one (1) LED segment, the light emitting diodes $LED_{II}$ and $LED_V$ are simultaneously enabled.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A display system for displaying the levels of at least first and second input signals comprising:
   a single array of display segments arranged in single file between a first and a second end thereof; and
   a driver circuit responsive to said at least first and second input signals for selectively enabling said display segments, said drive circuit comprising:
   first control responsive to said first input signal for determining the level thereof;
   first drive means responsive to said first control means for enabling at least a selected display segment having a location corresponding to the level of said first input signal as counted from a first end of said array of display segments representative of a zero level of said first signal;
   second control means responsive to said first input signal for determining the level thereof; and
   second drive means responsive to said second control means for enabling at least a selected display segment having a location corresponding to the level of said second input signal as counted from a second end of said array of display segments representative of a zero level of said second signal;
   said first and second drive means thereby selectively enabling the same display segments within said single array.

2. The display system of claim 1, wherein said single array of display segments comrpises light emitting diodes calinearly aligned.

3. The display system of claim 1 or 2, wherein:
   said first control means comprises a level discriminator connected to receive a left channel stereo sound signal;
   said first end of said array being the left end of said array;
   said second control means comprises a level discriminator connected to receive a right channel stereo sound signal; and
   said second end of said array is the right end of said array.

4. The display system of claim 1, wherein:
   said first drive means enables a selected number of display segments counted from said first end of said array of display segments, said selected number corresponding to said level of said first input signal; and said second drive means enables a selected number of display segments counted from said second end of said array of display segments, said selected number being corresponding to said level of said second input signal.

5. The display of claim 4, wherein said first and second drive means drive a display segment at a higher brightness than the remaining display segments when said display segment is located at a position where said numbers counted from said first end and said second end overlap each other.

6. A display system for displaying the levels of at least first and second input signals comprising:
   a single array of display segments arranged in a single file between a first and a second end thereof;

first drive means operatively interconnected with all of said display segments and responsive to a first input signal for energizing at least one segment in said array corresponding to the level of said first signal, said at least one segment energized by said first drive means being spaced from said first end of said array, representative of a zero signal level of said first signal, by a number of segments corresponding to the relative level of said first signal;

second drive means operatively interconnected with all of said display segments and responsive to a second input signal for energizing at least one segment in said array corresponding to the level of said second signal, said at least one segment energized by said second drive means being spaced from said second end of said array, representative of a zero signal level of said second signal, by a number of segments corresponding to the relative level of said second signal.

7. The display system of claim 6 wherein said segments are light emitting diodes.

8. The display system of claim 6 wherein said segments are arranged in a line.

9. The display system of claim 6 wherein said first drive means energizes each display segment between said first end and said segment corresponding to the level of said first signal and said second drive means energizes each display segment between said second end and said segment corresponding to the level of said second signal.

10. The display system of claim 9 wherein each display segment driven by both said first and second drive means is illuminated more brightly than those display segments illuminated by only a single drive means.

11. The display system of claim 6 further comprising means for inhibiting the illumination of both those display segments between said first end and said segment corresponding to the level of said first signal and those display segments between said second end and said segment corresponding to the level of said second signal but are not the segment corresponding to the level of either the first or second signal.

* * * * *